United States Patent
Yu et al.

(10) Patent No.: US 8,349,741 B2
(45) Date of Patent: *Jan. 8, 2013

(54) AMORPHOUS CARBON DEPOSITION METHOD FOR IMPROVED STACK DEFECTIVITY

(75) Inventors: Hang Yu, Woodland, CA (US); Deenesh Padhi, Sunnyvale, CA (US); Man-Ping Cai, Saratoga, CA (US); Naomi Yoshida, Sunnyvale, CA (US); Li Yan Miao, San Francisco, CA (US); Siu F. Cheng, Los Angeles, CA (US); Shahid Shaikh, Santa Clara, CA (US); Sohyun Park, Fremont, CA (US); Heung Lak Park, Santa Clara, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/455,916

(22) Filed: Apr. 25, 2012

(65) Prior Publication Data

US 2012/0208374 A1    Aug. 16, 2012

Related U.S. Application Data

(63) Continuation of application No. 13/093,679, filed on Apr. 25, 2011, now Pat. No. 8,227,352.

(60) Provisional application No. 61/330,029, filed on Apr. 30, 2010, provisional application No. 61/346,631, filed on May 20, 2010.

(51) Int. Cl.
*H01L 21/308* (2006.01)
*H01L 21/32* (2006.01)

(52) U.S. Cl. ............... 438/703; 438/761; 257/E21.258; 257/E21.231

(58) Field of Classification Search .................. None
See application file for complete search history.

(56) References Cited

U.S. PATENT DOCUMENTS

| | | |
|---|---|---|
| 2003/0091938 A1 | 5/2003 | Fairbairn et al. |
| 2005/0142361 A1 | 6/2005 | Nakanishi et al. |
| 2006/0222771 A1 | 10/2006 | Seamons et al. |
| 2006/0231524 A1 | 10/2006 | Liu et al. |

(Continued)

OTHER PUBLICATIONS

International Search Report and Written Opinion Dated Dec. 28, 2011 for International Application No. PCT/US2011/033750. (APPM/013958PCT).

*Primary Examiner* — Seahvosh Nikmanesh
(74) *Attorney, Agent, or Firm* — Patterson & Sheridan, LLP

(57) ABSTRACT

Embodiments described herein relate to materials and processes for patterning and etching features in a semiconductor substrate. In one embodiment, a method of forming a composite amorphous carbon layer is provided. The method comprises positioning a substrate in a process chamber, introducing a hydrocarbon source gas into the process chamber, introducing a diluent source gas into the process chamber, introducing a plasma-initiating gas into the process chamber, generating a plasma in the process chamber, forming an amorphous carbon initiation layer on the substrate, wherein the hydrocarbon source gas has a volumetric flow rate to diluent source gas flow rate ratio of 1:12 or less, and forming a bulk amorphous carbon layer on the amorphous carbon initiation layer, wherein a hydrocarbon source gas used to form the bulk amorphous carbon layer has a volumetric flow rate to a diluent source gas flow rate of 1:6 or greater.

19 Claims, 8 Drawing Sheets

U.S. PATENT DOCUMENTS

| | | |
|---|---|---|
| 2007/0295272 A1 | 12/2007 | Padhi et al. |
| 2008/0254233 A1 | 10/2008 | Lee et al. |
| 2009/0263972 A1 | 10/2009 | Balseanu et al. |
| 2010/0093187 A1 | 4/2010 | Lee et al. |
| 2012/0015521 A1* | 1/2012 | Yu et al. .................. 438/703 |

* cited by examiner

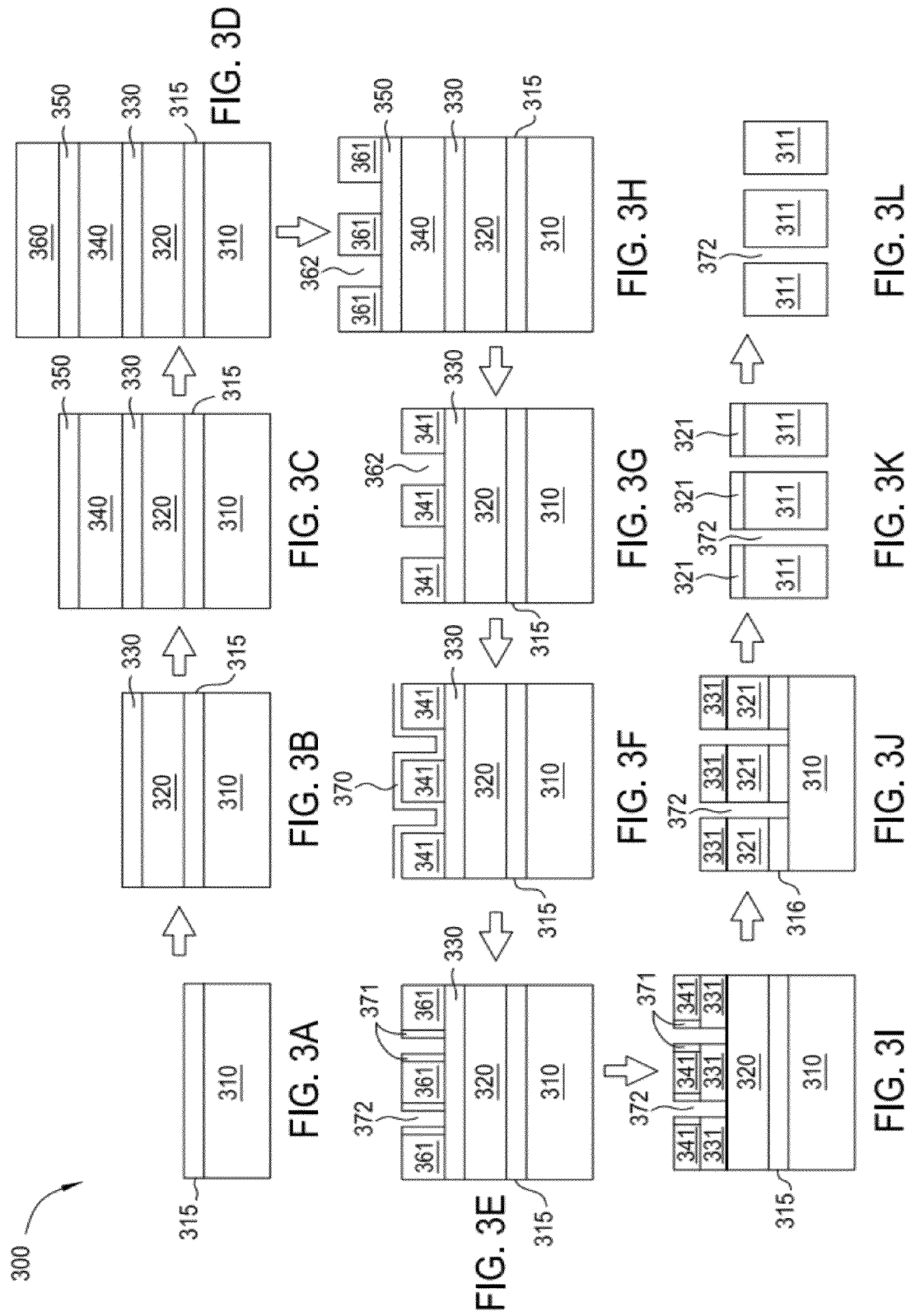

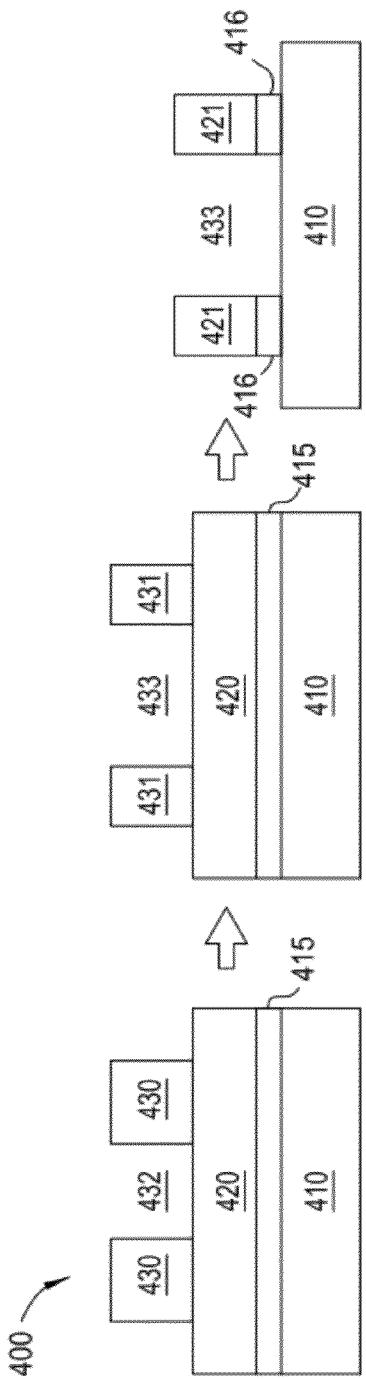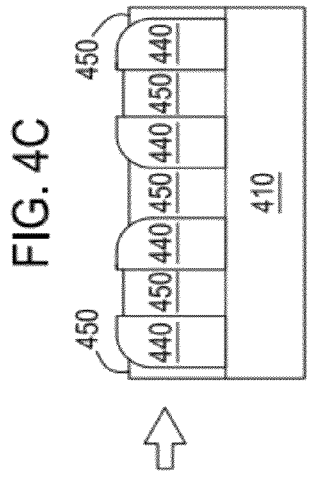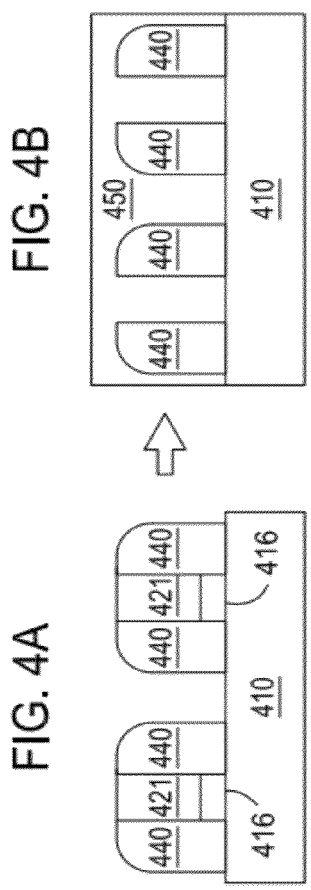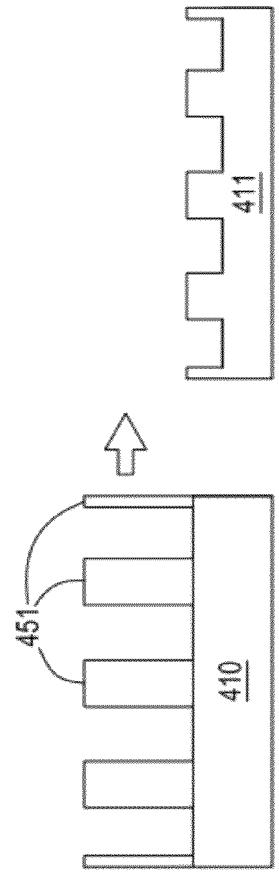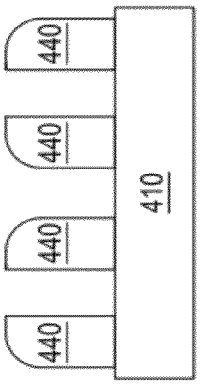

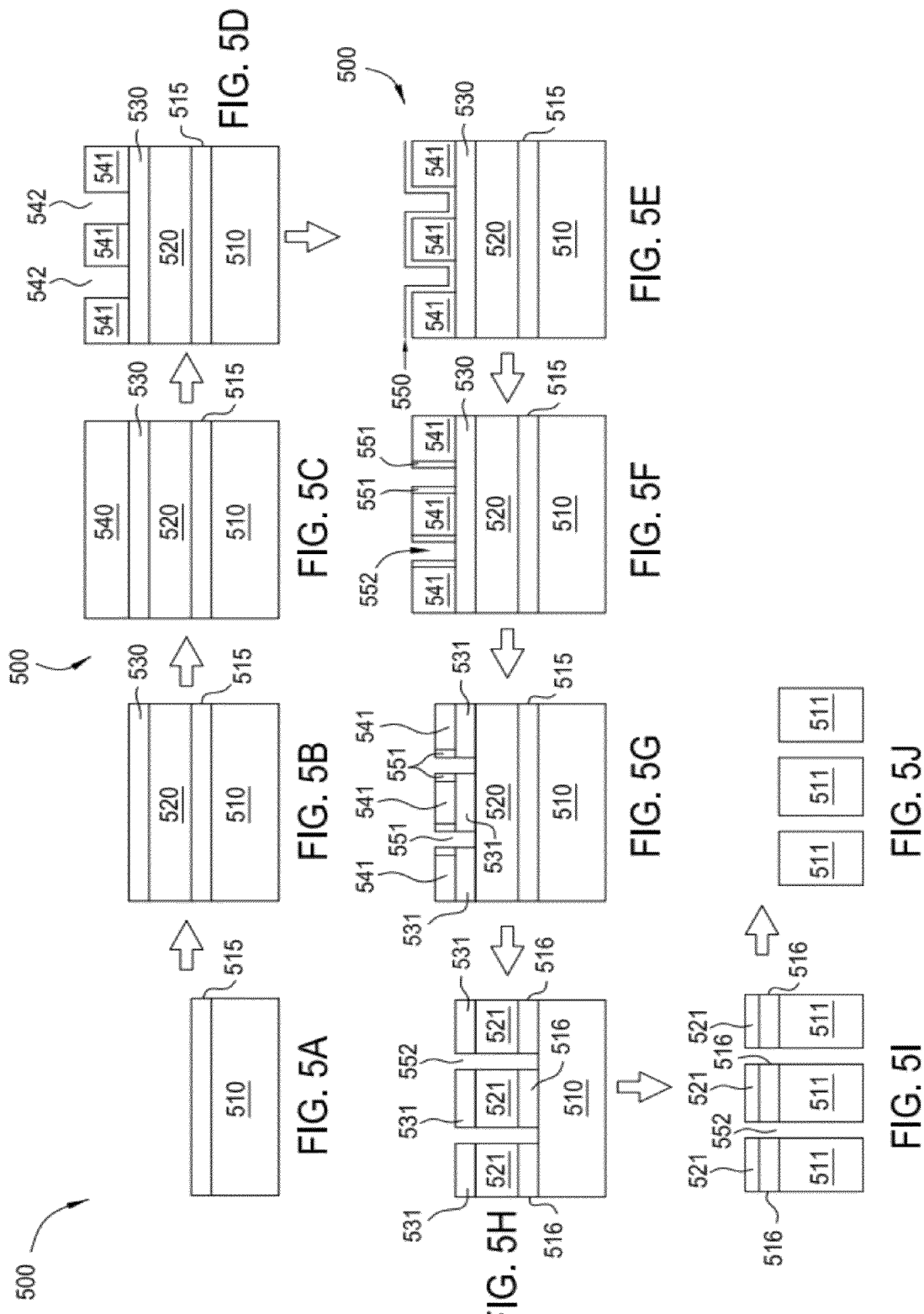

AMORPHOUS CARBON DEPOSITION METHOD FOR IMPROVED STACK DEFECTIVITY

CROSS-REFERENCE TO RELATED APPLICATIONS

This application is a continuation of U.S. Ser. No. 13/093,679, filed Apr. 25, 2011, which claims benefit of U.S. Provisional Patent Application Ser. No. 61/330,029, filed Apr. 30, 2010 and U.S. Provisional Patent Application Ser. No. 61/346,631, filed May 20, 2010, all of which are herein incorporated by reference in their entirety.

BACKGROUND OF THE INVENTION

1. Field of the Invention

Embodiments of the present invention relate to the fabrication of integrated circuits. More particularly, embodiments of the present invention relate to materials and processes for patterning and etching features in a semiconductor substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having sub-65 nm and even sub-45 nm feature sizes, and tomorrow's facilities soon will be producing devices having even smaller feature sizes.

The continued reduction in device geometries has generated a demand for methods of forming nanometer scale features that are separated by nanometer scale distances on semiconductor substrates. As the minimum feature size decreases, the semiconductor industry is facing the limitation of patterning sub-32 nm due to the limits of optical resolution being approached in current lithography processes. One method that has been developed to reduce the distance between features or devices on a substrate includes a double patterning of a hardmask layer that is used to transfer a pattern into the substrate.

One type of double patterning includes printing of a core pattern using conventional lithographical technology followed by subsequent deposition of a conformal spacer around the core feature. Following deposition of the spacer, various methods can be applied to achieve pattern density doubling that of the core.

In one version of double patterning, polysilicon is selected as the core patterning material. However, polysilicon has a high surface roughness which after deposition of subsequent film layers becomes decorated into bigger size defects. If neglected at the 32 nm node these defects can potentially cause lithographic and patterning defects which typically lead to killer defects such as broken patterns and bridged lines. This phenomenon is known as "Stack Defectivity" and is not limited to polysilicon substrates.

Therefore, there is a need for materials and processes for patterning and etching features in a semiconductor substrate that minimize the decoration effect, thereby significantly reducing stack defectivity.

SUMMARY OF THE INVENTION

Embodiments of the present invention relate to the fabrication of integrated circuits. More particularly, embodiments of the present invention relate to materials and processes for patterning and etching features in a semiconductor substrate. In one embodiment, a method of forming a composite amorphous carbon layer for improved stack defectivity on a substrate is provided. The method comprises introducing a hydrocarbon source gas into a process chamber containing a substrate, introducing a diluent source gas into the process chamber, introducing a plasma-initiating gas into the process chamber, generating a plasma in the process chamber, forming an amorphous carbon initiation layer on the substrate, wherein a ratio of a volumetric flow rate of the hydrocarbon source gas to a volumetric flow rate of the diluent source gas is 1:12 or less, and forming a bulk amorphous carbon layer on the amorphous carbon initiation layer, wherein a ratio of a volumetric flow rate of a hydrocarbon source gas used to form the bulk amorphous carbon layer to a volumetric flow rate of a diluent source gas is 1:6 or greater to form the composite amorphous carbon layer.

In another embodiment, a method of forming a device is provided. The method comprises forming an amorphous carbon initiation layer on a substrate by providing a gas mixture to a process chamber containing a substrate, wherein the gas mixture comprises a hydrocarbon source gas, a diluent source gas, and a plasma-initiating gas, wherein a ratio of a volumetric flow rate of the hydrocarbon source gas to a volumetric flow rate of the diluent source gas is 1:12 or less, and generating a plasma in the process chamber to decompose the hydrocarbon source gas in the gas mixture to form the amorphous carbon initiation layer on the substrate. A bulk amorphous carbon layer is formed on the amorphous carbon initiation layer, wherein a hydrocarbon source gas and a diluent source gas are used to form the bulk amorphous carbon layer, wherein a ratio of a volumetric flow rate of the hydrocarbon source gas to a volumetric flow rate of the diluent source gas is 1:6 or greater to form the composite amorphous carbon layer. A pattern is defined in at least one region of the bulk amorphous carbon layer and the amorphous carbon initiation layer and the pattern defined in the at least one region of the bulk amorphous carbon layer and the amorphous carbon initiation layer is transferred into the substrate using the bulk amorphous carbon layer and the amorphous carbon initiation layer as a mask.

In one embodiment, the as-deposited composite amorphous carbon layer has an adjustable hydrogen content that ranges from about 10% hydrogen to about 25% hydrogen and an adjustable carbon content that ranges from about 75% to about 90% carbon. In another embodiment, the as-deposited composite amorphous carbon layer has an adjustable hydrogen content of about 17.5% hydrogen and an adjustable carbon content of about 82.5%. In another embodiment, the as-deposited composite amorphous carbon layer has an adjustable hydrogen content that ranges from about 10% hydrogen to about 50% hydrogen and an adjustable carbon content that ranges from about 50% to about 90% carbon. In yet another embodiment, the as-deposited composite amorphous carbon layer has an adjustable hydrogen content that ranges from about 25% hydrogen to about 50% hydrogen and an adjustable carbon content that ranges from about 50% to about 75% carbon.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3L are schematic side views of a process for using an amorphous carbon initiation layer as described herein to etch a material layer;

FIGS. 4A-4H are schematic side views of a process for using an amorphous carbon initiation layer as described herein in a space mask double patterning process;

FIGS. 5A-5J are schematic side views of a process for using an amorphous carbon initiation layer as described herein to etch a material layer;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
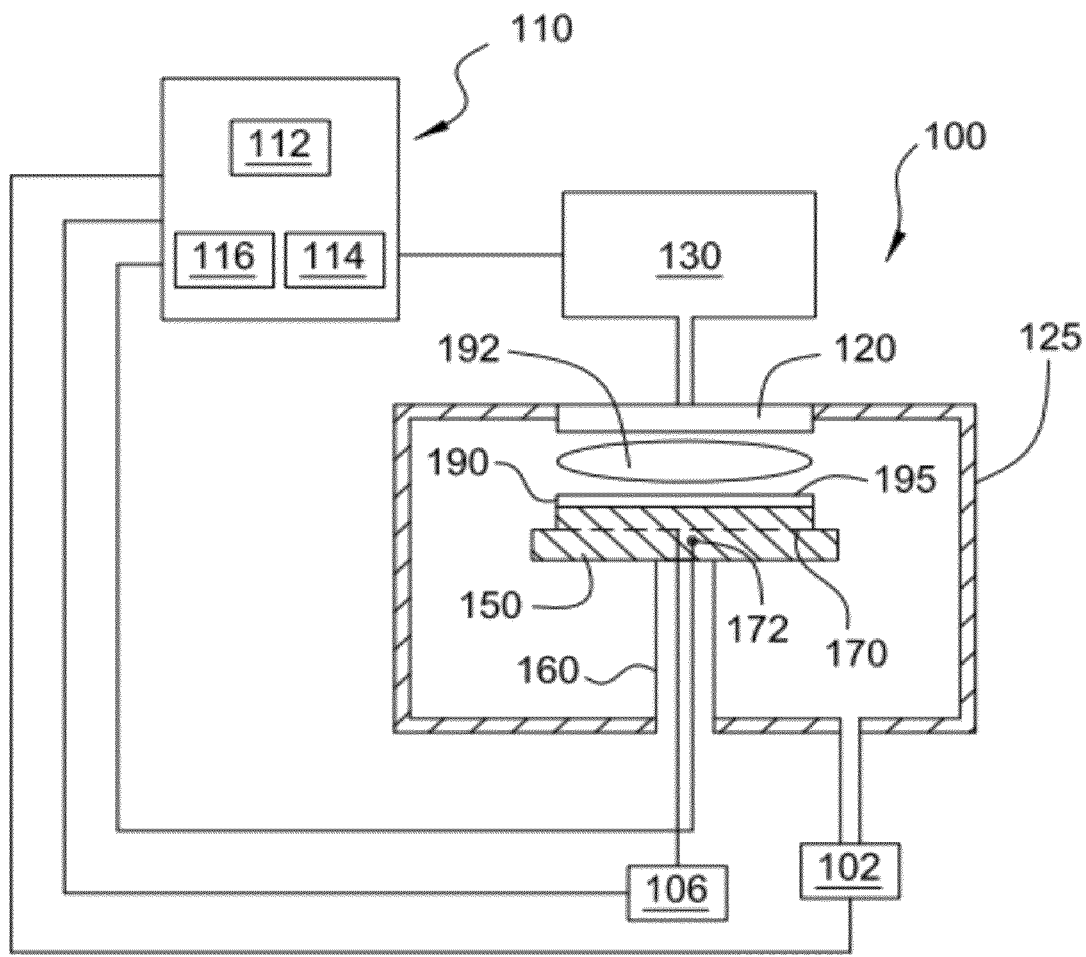
FIG. 1 is a schematic representation of a substrate processing system that can be used to perform amorphous carbon layer deposition according to embodiments described herein.

Embodiments of the present invention relate to the fabrication of integrated circuits. More particularly, embodiments of the present invention relate to materials and processes for patterning and etching features in a semiconductor substrate. Step coverage is defined as the ratio of the thickness of a deposited film over steps, defects, or features (surface topography) relative to the thickness of the film in a flat area. Step coverage comparisons provide evidence that stack defects form via lateral expansion of under-layer defects during deposition of subsequent layers. Therefore, it is believed that suppressing lateral expansion of under-layer defects will reduce stack defects. Certain embodiments described herein involve the deposition of an amorphous carbon initiation layer having zero to 'negative' step coverage via a chemical vapor deposition (CVD) process.

The amorphous carbon initiation layer ensures that the underlying topography and/or seed particles are buried to provide a planar surface prior to deposition of an overlying amorphous carbon bulk film. This composite layer comprising the amorphous carbon initiation layer and the amorphous carbon bulk film layer reduces stack defectivity by at least an order of magnitude compared with deposition of the amorphous carbon bulk film alone. The thickness of the amorphous carbon initiation layer is typically chosen to substantially match the height of the largest defect present. In one embodiment, the amorphous carbon initiation layer has a thickness between about 100 Å to about 1,000 Å, preferably between about 200 Å to about 500 Å.

The process parameters and chemistry during deposition of the amorphous carbon initiation layer are important for achieving the desired results. In certain embodiments, the process parameters and precursor flow rates are selected such that the amorphous carbon initiation layer deposits from the side of the defect rather than on the top of the defect as would take place in typical conformal deposition processes which mimic the surface topography of the underlying layer. In one embodiment, a hydrocarbon precursor ($C_xH_y$) is mixed with $H_2$ diluent along with optional inert gases such as He or Ar. The ratio of the hydrocarbon precursor to the $H_2$ diluent is important. A lower ratio of hydrocarbon precursor to $H_2$ diluent reduces the step coverage of the amorphous carbon initiation layer, and thus, the amorphous carbon initiation layer is more effective in 'burying' the defects without lateral growth. However, a ratio of hydrocarbon precursor to $H_2$ diluent that is too low, may lead to enhanced 'etching' around the perimeters of defect sites which can cause undercuts and subsequently, resist scumming during patterning. Therefore, an improved chemistry is provided in order to meet the above two conflicting requirements. In certain embodiments, the deposition conditions of the amorphous carbon initiation layer may be further fine-tuned to obtain a film property closely matching with that of the bulk film such that there is no etch differential induced in the pattern.

FIG. 1 is a schematic representation of a substrate processing system 100, which can be used for amorphous carbon initiation layer deposition according to embodiments described herein. Examples of suitable systems include the CENTURA® systems which may use a DxZ™ process chamber, PRECISION 5000® systems, PRODUCER™ systems, such as the PRODUCER SE™ process chamber and the PRODUCER GT™ process chamber, all of which are commercially available from Applied Materials, Inc., of Santa Clara, Calif. It is contemplated that the processes described herein may be performed on other substrate processing systems, including those from other manufacturers.

System 100 includes a process chamber 125, a gas panel 130, a control unit 110, and other hardware components such as power supplies and vacuum pumps. Further details of one embodiment of the system used in the embodiments described herein are described in a commonly assigned U.S. patent "High Temperature Chemical Vapor Deposition Chamber", U.S. Pat. No. 6,364,954, issued on Apr. 2, 2002.

The process chamber 125 generally comprises a substrate support pedestal 150, which is used to support a substrate such as a semiconductor substrate 190. This substrate support pedestal 150 moves in a vertical direction inside the process chamber 125 using a displacement mechanism (not shown) coupled to shaft 160. Depending on the process, the semiconductor substrate 190 can be heated to a desired temperature prior to processing. The substrate support pedestal 150 is heated by an embedded heater element 170. For example, the substrate support pedestal 150 may be resistively heated by applying an electric current from a power supply 106 to the heater element 170. The semiconductor substrate 190 is, in turn, heated by the substrate support pedestal 150. A temperature sensor 172, such as a thermocouple, is also embedded in the substrate support pedestal 150 to monitor the temperature of the substrate support pedestal 150. The measured temperature is used in a feedback loop to control the power supply 106 for the heater element 170. The substrate temperature can be maintained or controlled at a temperature that is selected for the particular process application.

A vacuum pump 102 is used to evacuate the process chamber 125 and to maintain the proper gas flows and pressure inside the process chamber 125. A showerhead 120, through which process gases are introduced into process chamber 125, is located above the substrate support pedestal 150 and is adapted to provide a uniform distribution of process gases into the process chamber 125. The showerhead 120 is connected to a gas panel 130, which controls and supplies the various process gases used in different steps of the process sequence. Process gases may include a hydrocarbon source, a diluent source gas such as hydrogen, and optionally, a plasma-initiating gas and are described in more detail below in conjunction with a description of an exemplary amorphous carbon initiation layer deposition process.

The gas panel 130 may also be used to control and supply various vaporized liquid precursors. While not shown, liquid precursors from a liquid precursor supply may be vaporized, for example, by a liquid injection vaporizer, and delivered to the process chamber 125 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 120 and substrate support pedestal 150 may also form a pair of spaced electrodes. When an electric field is generated between these electrodes, the process gases introduced into chamber 125 are ignited into a plasma 192. Typically, the electric field is generated by connecting the substrate support pedestal 150 to a source of single-frequency or dual-frequency radio frequency (RF) power (not shown) through a matching network (not shown). Alternatively, the RF power source and matching network may be coupled to the showerhead 120, or coupled to both the showerhead 120 and the substrate support pedestal 150.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas and liquid flows through the gas panel 130 is performed by mass flow controllers (not shown) and a control unit 110 such as a computer. The showerhead 120 allows process gases from the gas panel 130 to be uniformly distributed and introduced into the process chamber 125. Illustratively, the control unit 110 comprises a central processing unit (CPU) 112, support circuitry 114, and memories containing associated control software 116. This control unit 110 is responsible for automated control of the numerous steps required for substrate processing, such as substrate transport, gas flow control, liquid flow control, temperature control, chamber evacuation, and so on. When the process gas mixture exits the showerhead 120, plasma enhanced thermal decomposition of the hydrocarbon compound occurs at the surface 195 of the semiconductor substrate 190, resulting in the deposition of a nitrogen doped amorphous carbon layer on the semiconductor substrate 190.

Figure 2A:
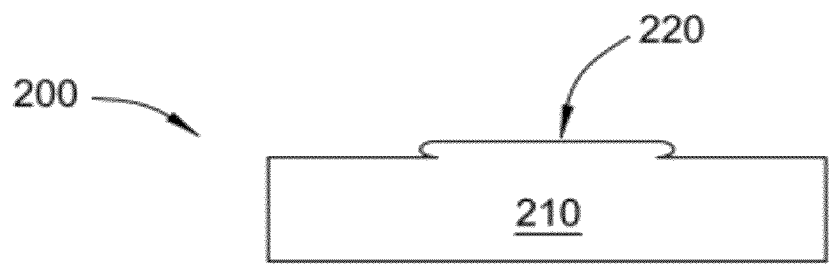
FIGS. 2A-2C depict schematic cross-sectional views of a substrate structure at different stages of processing according to embodiments described herein.
Figure 2B:
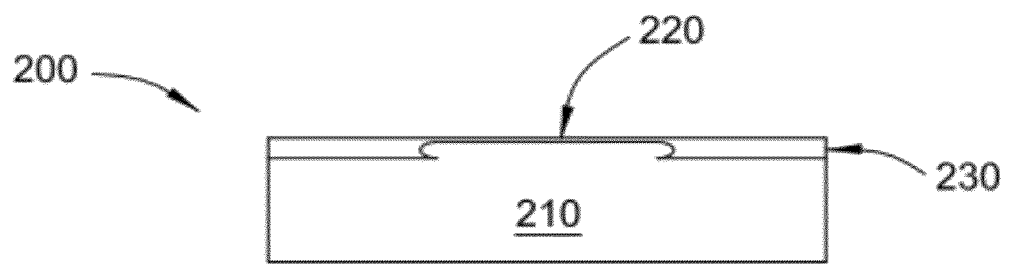
Figure 2C:
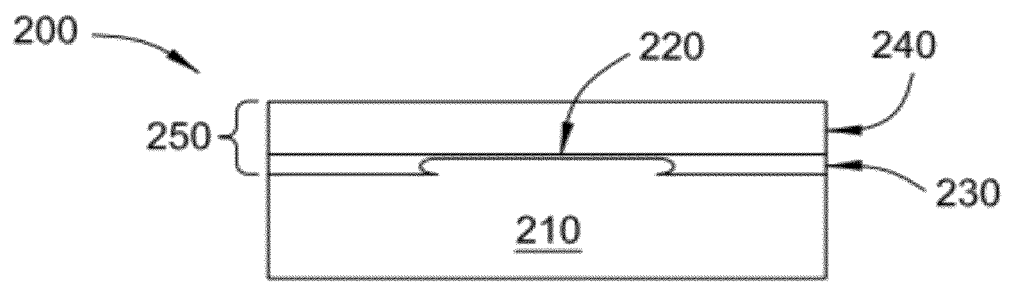

FIGS. 2A-2C depict schematic cross-sectional views of a material stack 200 at different stages of processing according to embodiments described herein. A base material 210 having a defect 220 formed thereon is deposited on a substrate surface (not shown) to begin forming a material stack 200. The base material 210 may be one or more materials used in forming semiconductor device including a silicon substrate material, an oxide material, a polysilicon material, or the like. An amorphous carbon initiation layer 230 is deposited on the base material 210. The amorphous carbon initiation layer 230 may be an amorphous carbon material as described herein. As shown in FIG. 2B, the amorphous carbon initiation layer 230 has substantially zero step coverage and suppresses the lateral growth of the defect 220. The thickness of the amorphous carbon initiation layer may be chosen to substantially match the height of the largest defect present. In one embodiment, the amorphous carbon initiation layer has a thickness between about 100 Å and about 1,000 Å. In one embodiment, the amorphous carbon initiation layer has a thickness between about 200 Å to about 500 Å. As shown in FIG. 2C, a bulk amorphous carbon layer 240 is deposited on the amorphous carbon initiation layer 230 to form a composite layer 250. The bulk amorphous carbon layer 240 may be, for example, an Advanced Patterning Film™ (APF) material commercially available from Applied Materials, Inc. of Santa Clara, Calif., or alternatively, an amorphous carbon material as described herein.

Amorphous Carbon Initiation Layer Formation

In one embodiment described herein, an amorphous carbon initiation layer, such as amorphous carbon initiation layer 230 is formed by a process that includes introducing a hydrocarbon source, a diluent gas, and a plasma-initiating gas into a process chamber, such as process chamber 125 described above in conjunction with FIG. 1. In one embodiment, the hydrocarbon source gas is a mixture of one or more hydrocarbon compounds, and, optionally a carrier gas, such as argon.

In one embodiment, the hydrocarbon compounds may be partially or completely doped derivatives of hydrocarbon compounds, including fluorine-, oxygen-, hydroxyl group-, and boron-containing derivatives of hydrocarbon compounds.

Hydrocarbon compounds or derivatives thereof that may be included in the hydrocarbon source gas may be described by the formula $C_xH_y$, where x has a range of between 1 and 10 and y has a range of between 2 and 30.

Suitable hydrocarbon compounds include one or more of the following compounds, for example, alkynes such as acetylene ($C_2H_2$), propylene ($C_3H_6$), propyne ($C_3H_4$), propane ($C_3H_8$), butane ($C_4H_{10}$), butylene ($C_4H_8$), butadiene ($C_4H_6$), vinylacetylene and derivatives thereof, aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like. Additional suitable hydrocarbons include alkenes such as ethylene, propylene, butylene, pentene, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like.

Suitable diluent gases include hydrogen ($H_2$), ammonia ($NH_3$), CO, $CO_2$, and combinations thereof.

Similarly, a variety of gases such as nitrogen ($N_2$), ammonia ($NH_3$), or combinations thereof, among others, may be added to the gas mixture, if desired. Ar, He, and $N_2$ are used to control the density and deposition rate of the amorphous carbon initiation layer. The addition of $N_2$ and/or $NH_3$ can be used to control the hydrogen ratio of the amorphous carbon initiation layer.

In certain embodiments, the amorphous carbon initiation layer deposition process includes the use of a plasma-initiating gas that is introduced into the chamber before, after, and/or at the same time as the hydrocarbon compound and a plasma is initiated to begin deposition. The plasma-initiating gas may be a high ionization potential gas including, but not limited to, helium gas, hydrogen gas, nitrogen gas, argon gas and combinations thereof, of which helium gas is preferred. The plasma-initiating gas may also be a chemically inert gas, such as helium gas, nitrogen gas, argon gas, and combinations thereof, of which argon gas is preferred. Suitable ionization potentials for gases are from about 5 eV (electron potential) to 25 eV. The plasma-initiating gas may be introduced into the chamber before the nitrogen containing hydrocarbon source gas and/or the hydrocarbon source gas, which allows a stable plasma to be formed and reduces the chances of arcing. An inert gas used as a diluent gas or a carrier gas, such as argon, may be introduced with the plasma-initiating gas, the nitrogen containing hydrocarbon source, the hydrocarbon source, or combinations thereof.

In one embodiment, the hydrocarbon compound and the diluent gas may be introduced at a hydrocarbon compound to diluent gas flow ratio from about 1:3 or less, for example, from about 1:32 to 1:3, such as from about 1:15 to about 1:8 for the amorphous carbon initiation layer deposition. In one embodiment, the hydrocarbon compound and the diluent gas may be introduced at a hydrocarbon compound to diluent gas flow ratio from about 1:12 or less, for example, from about 1:18 to about 1:14. In one embodiment, the hydrocarbon compound and the diluent gas may be introduced at a hydrocarbon compound to diluent gas flow ratio from about 1:15 or less. In one embodiment, the hydrocarbon compound and the diluent gas may be introduced at a hydrocarbon compound to diluent gas flow ratio from about 1:32 to about 1:18.

The amorphous carbon initiation layer may be deposited from the process gas by maintaining a chamber pressure of about 0.5 Torr or greater, such as from about 0.5 Torr to about 20 Torr, and in one embodiment, about 6 Torr or greater, for example, from about 6 Torr to about 8 Torr. In one embodiment, the chamber pressure may be maintained from about 1 Torr to 9 Torr, for example, about 3 Torr.

The amorphous carbon initiation layer may be deposited from the hydrocarbon source gas and the diluent gas source in a chamber maintaining a substrate temperature from about 0° C. to about 800° C., such as at a temperature from about 200° C. to about 700° C. or at a temperature from about 300° C. to about 650° C., for example, from about 500° C. to about 650° C. In certain embodiments, a low substrate temperature from about 200° C. to about 300° C. may be used. It has been observed that depositing an amorphous carbon initiation layer at increased temperatures yields better defect 'buring' capability due to enhanced diffusion of surface atoms, and a denser film which correspondingly improves the etch selectivity of the film.

When depositing the amorphous carbon initiation layer, an electrode spacing between the showerhead and substrate surface may be between about 100 mils and 5,000 mils spacing, for example, about 400 mils spacing.

In certain embodiments, where plasma is used, the hydrocarbon source, the diluent gas source, and the plasma-initiating gas are introduced into the chamber and a plasma is initiated to begin deposition. A dual-frequency RF system may be used to generate the plasma. A dual frequency RF power application is believed to provide independent control of flux and ion energy, since it is believed that the energy of the ions hitting the film surface influences the film density. It is believed that the high frequency plasma controls plasma density and a low frequency plasma controls kinetic energy of the ions hitting the substrate surface. A dual-frequency source of mixed RF power provides a high frequency power in a range from about 10 MHz to about 30 MHz, for example, about 13.56 MHz, as well as a low frequency power in a range of from about 10 KHz to about 1 MHz, for example, about 350 KHz. When a dual frequency RF system is used to deposit an amorphous carbon initiation layer, the ratio of the second RF power to the total mixed frequency power is preferably less than about 0.6 to 1.0 (0.6:1). The applied RF power and use of one or more frequencies may be varied based upon the substrate size and the equipment used. In certain embodiments, a single frequency RF power application may be used, and is typically, an application of the high frequency power as described herein.

Plasma may be generated by applying RF power at a power density to substrate surface area of from about 0.01 W/cm$^2$ to about 5 W/cm$^2$, such as from about 0.01 to about 2 W/cm$^2$, for example, about 1.55 W/cm$^2$. The power application may be from about 1 Watt to about 2,000 watts, such as from about 1,000 W to about 1,700 W, for example about 1,400 W for a 300 mm substrate. In certain embodiments, the power application may be from about 500 watts to about 600 watts.

An exemplary deposition process for depositing an amorphous carbon initiation layer on a 300 mm circular substrate occurs at a high temperature and employs a plasma-initiating gas, such as argon, a hydrocarbon source, such as propylene ($C_3H_6$), and a diluent gas, such as hydrogen ($H_2$). The process includes supplying a plasma-initiating gas, such as argon, at a flow rate from about 0 sccm to about 50,000 sccm, for example, between about 1,000 sccm to about 2,000 sccm, supplying a hydrocarbon source, such as propylene ($C_3H_6$), at a flow rate from about 100 sccm to about 50,000 sccm, for example, from about 200 sccm to about 700 sccm, and supplying a diluent gas source, such as hydrogen ($H_2$), at a flow rate from about 10 sccm to about 20,000 sccm, for example, from about 7,000 sccm to about 9,000 sccm, applying a dual frequency RF power (about 13.56 MHz) from about 10 W to about 2,000 W, for example, from about 1,200 W to 1,600 W, maintaining a chamber pressure from about 0.5 Torr about 20 Torr, for example, from about 5 Torr to 8 Torr, and maintaining a substrate temperature from about 500° C. to about 600° C. This process range provides a deposition rate for an amorphous carbon layer in the range of about 100 Å/min to about 1,000 Å/min. One skilled in the art, upon reading the disclosure herein, can calculate appropriate process parameters in order to produce the amorphous carbon initiation layer of different deposition rates.

Another exemplary deposition process for depositing an amorphous carbon initiation layer on a 300 mm circular substrate occurs at a low temperature and employs a plasma-initiating gas, such as argon, a hydrocarbon source, such as propylene ($C_3H_6$), and a diluent gas, such as hydrogen ($H_2$). The process includes supplying a plasma-initiating gas, such as argon, at a flow rate from about 0 sccm to about 50,000 sccm, supplying a hydrocarbon source, such as propylene ($C_3H_6$), at a flow rate from about 100 sccm to about 50,000 sccm, and supplying a diluent gas source, such as hydrogen ($H_2$), at a flow rate from about 10 sccm to about 20,000 sccm, applying a dual frequency RF power (about 13.56 MHz) from about 10 W to about 2,000 W, for example, from about 500 W to 600 W, maintaining a chamber pressure from about 0.5 Torr about 20 Torr, for example, from about 0.5 Torr to 4 Torr, and maintaining a substrate temperature from about 200° C. to about 300° C. The flow rates of the hydrocarbon source gas and the diluent source gas may be adjusted to achieve a hydrocarbon compound to diluent gas flow ration of from about 1:32 to 1:18. One skilled in the art, upon reading the disclosure herein, can calculate appropriate process parameters in order to produce the amorphous carbon initiation layer of different deposition rates.

Amorphous Carbon Bulk Layer Formation

In one embodiment described herein, an amorphous carbon bulk layer, such as bulk amorphous carbon layer 240 is formed by a process that includes introducing a hydrocarbon source, a diluent gas, and optionally, a plasma-initiating gas into a process chamber, such as process chamber 125 described above in conjunction with FIG. 1. In one embodiment, the bulk amorphous carbon layer 240 may be an Advanced Patterning Film™ (APF) material commercially available from Applied Materials, Inc. of Santa Clara, Calif. In one embodiment, the hydrocarbon source gas is a mixture of one or more hydrocarbon compounds, and, optionally a carrier gas, such as argon. In one embodiment, the precursors and process gases used to deposit the amorphous carbon bulk layer are identical to the precursors used to deposit the amorphous carbon initiation layer, however, the flow rates for the precursors and process gases are different. The process conditions used to deposit the amorphous carbon bulk layer may also be similar to the process conditions described above in conjunction with the amorphous carbon initiation layer deposition.

In one embodiment, the following deposition process parameters can be used to form the amorphous carbon bulk layer. The process parameters range from a substrate temperature of about 200° C. to about 700° C., a chamber pressure of about 1 Torr to about 20 Torr, a RF power of between about 3 W/in$^2$ to about 20 W/in$^2$, and a plate spacing of between about 300 mils to about 600 mils. The above process parameters provide a typical deposition rate for the amorphous carbon layer in the range of about 500 Å/min to about 3,000 Å/min and can be implemented on a 300 mm substrate in a deposition chamber available from Applied Materials, Inc. of Santa Clara, Calif.

The hydrocarbon compound and the diluent gas may be introduced at a hydrocarbon compound to diluent gas flow ratio from about 1:100 or greater, for example, from about 1:100 to 100:1, such as from about 1:10 to about 10:1 for the amorphous carbon bulk layer deposition. In one embodiment, the hydrocarbon compound to diluent gas flow ratio may be from about 1:4 or greater, such as from about 1:4 to about 2:1, for example, from about 1:2 to about 1:1, may be used for the amorphous carbon bulk layer deposition. In one embodiment, the hydrocarbon compound to diluent gas flow ratio may be from about 1:6 or greater, such as from about 1:6 to about 2:1, for example, from about 1:2 to about 1:1, may be used for the amorphous carbon bulk layer deposition.

An exemplary deposition process for depositing an amorphous carbon bulk layer on an amorphous carbon initiation layer over a 300 mm circular substrate employs a plasma-initiating gas, such as argon, a hydrocarbon source, such as propylene ($C_3H_6$), and a diluent gas, such as hydrogen ($H_2$). The process may include supplying a plasma-initiating gas, such as argon, at a flow rate from about 0 sccm to about 50,000 sccm, for example, between about 1,000 sccm to about 2,000 sccm, supplying a hydrocarbon source, such as propylene ($C_3H_6$), at a flow rate from about 0 sccm to about 50,000 sccm, for example, from about 800 sccm to about 1,500 sccm, and supplying a diluent gas source, such as hydrogen ($H_2$), at a flow rate from about 10 sccm to about 10,000 sccm, for example, from about 3,000 sccm to about 6,000 sccm, applying a single HF RF or dual frequency RF power from about 10 W to about 2,000 W, for example, from about 1,200 W to 1,700 W, maintaining a chamber pressure from about 0.5 Torr to about 20 Torr, for example, from about 6 Torr to 8 Torr, and maintaining a substrate temperature about 500° C. to about 600° C. This process range provides a deposition rate for an amorphous carbon layer in the range of about 500 Å/min to about 3,000 Å/min. One skilled in the art, upon reading the disclosure herein, can calculate appropriate process parameters in order to produce the amorphous carbon bulk layer of different deposition rates.

EXAMPLES

The following non-limiting examples are provided to further illustrate embodiments described herein. However, the examples are not intended to be all inclusive and are not intended to limit the scope of the embodiments described herein.

A 300 Å amorphous carbon initiation layer was deposited on a polysilicon substrate in a Producer® system. The amorphous carbon initiation layer was deposited as follows: providing a flow rate of argon to the process chamber of about 1,600 sccm, providing a flow rate of hydrogen ($H_2$) to the process chamber of about 8,000 sccm, providing a flow rate of propylene ($C_3H_6$) to the process chamber of about 500 sccm, applying a high frequency RF power (13.56 MHz) at about 1,400 W, maintaining a deposition temperature of about 550° C., maintaining a chamber pressure of about 7 Torr, with a spacing of about 400 mils, for a time period of about 56 seconds.

A 1,700 Å amorphous carbon bulk layer was deposited on the amorphous carbon initiation layer in the Producer® system. The amorphous carbon bulk layer was deposited as follows: providing a flow rate of argon to the process chamber of about 1,600 sccm, providing a flow rate of hydrogen ($H_2$) to the process chamber of about 4,000 sccm, providing a flow rate of propylene ($C_3H_6$) to the process chamber of about 1,000 sccm, applying a high frequency RF power (13.56 MHz) at about 1,400 W, maintaining a deposition temperature of about 550° C., maintaining a chamber pressure of about 7 Torr, with a spacing of about 400 mils, for a time period of about 106 seconds.

FIGS. 3A-3L are schematic side views of a process for using an amorphous carbon initiation layer as described herein to etch a material layer. A base material 310 is deposited on a substrate surface (not shown) to begin forming a material stack 300. The base material 310 may be one or more materials used in forming semiconductor devices including a silicon substrate material, an oxide material, a polysilicon material, or the like. An amorphous carbon initiation layer 315 formed according to embodiments described herein is deposited on the base material 310 to conceal any defects present on the surface of the base material 310 and provide a planarized surface of the deposition of subsequent layers. A first amorphous carbon layer 320 is deposited on the amorphous carbon initiation layer 315 and a first anti-reflective coating material 330 is deposited on the first amorphous carbon layer 320 as shown in FIG. 3B. The amorphous carbon layer may be an Advanced Patterning Film™ (APF) material commercially available from Applied Materials, Inc. of Santa Clara, Calif., or alternatively, an amorphous carbon material as described herein. The first anti-reflective coating material 330 is used to control the reflection of light during a lithographic patterning process. The first anti-reflective coating material 330 may comprise silicon dioxide, silicon oxynitride, silicon nitride, or combinations thereof. The anti-reflective coating material may be a DARC™ material layer commercially available from Applied Materials, Inc. of Santa Clara, Calif.

A second amorphous carbon layer 340 and a second anti-reflective coating material 350 may be deposited sequentially on the first anti-reflective coating material as shown in FIG. 3C. The second amorphous carbon layer 340 and second anti-reflective coating material 350 may be the same materials as deposited for layer 320 and first anti-reflective coating material 330. A resist layer 360, such as a photoresist material, is then deposited on the second anti-reflective coating material 350 as shown in FIG. 3D. The resist layer is then patterned by a lithographic process producing a patterned resist layer 361 as shown in FIG. 3E. The first pattern 362 formed in the resist layer 361 is transferred to the second amorphous carbon layer 340 to form a patterned second amorphous carbon layer 341 by first etching the second anti-reflective coating material 350 and then the second amorphous carbon layer 340 by one or more etching processes as shown in FIG. 3F. The patterned second amorphous carbon layer 341 may perform as a hardmask for the underlying material. The second anti-reflective coating material 350 may be removed by the one or more etching processes or by a separate process.

A conformal amorphous carbon layer 370 is deposited on the first anti-reflective coating material 330 and the patterned second amorphous carbon layer 341 as shown in FIG. 3G. The conformal amorphous carbon layer 370 is patterned by an anisotropic etch process to provide for sidewall amorphous carbon materials 371 as shown in FIG. 3H. The presence of the sidewall amorphous carbon materials 371 allows for the formation of a second pattern 372 with reduced critical dimensions and feature sizes, i.e., increased pattern density, than can otherwise normally be achieved through current photolithographic processes. The patterned second amorphous carbon layer 341 in combination with the sidewall amorphous carbon materials 371 may perform as a hardmask layer for the underlying first anti-reflective coating material 330 and the first amorphous carbon layer 320.

The first anti-reflective coating material 330 is then etched to form a patterned anti-reflective coating layer 331 with the second pattern 372 as shown in FIG. 3I. The patterned second amorphous carbon layer 341 and the sidewall amorphous carbon materials 371 are removed during the etching process or by a subsequent process. The amorphous carbon initiation layer 315 and the first amorphous carbon layer 320 are then etched to form a patterned first amorphous carbon layer 321 and patterned amorphous carbon initiation layer 316 having the second pattern 372 to be transferred to the underlying base material 310. In one embodiment, the amorphous carbon initiation layer 315 and the first amorphous carbon layer 320 are etched in a single step. In another embodiment, the amorphous carbon initiation layer 315 and the first amorphous carbon layer 320 are etched in separate steps. The base material 310 is then etched using the patterned first amorphous carbon layer 321 and the patterned amorphous carbon initiation layer 316 as a hardmask layer as shown in FIG. 3K. The patterned first amorphous carbon layer 321 and the patterned amorphous carbon initiation layer 316 are removed to provide a substrate surface with a patterned base material 311 having the second pattern 372 as shown in FIG. 3L.

In an alternative embodiment, a patterned resist material is used in place of the patterned second amorphous carbon layer 341 for FIGS. 3F-3L, thereby eliminating the need for the patterned second amorphous carbon layer 341 and a second anti-reflective coating material 350 and the corresponding deposition steps and etching steps of FIGS. 3C-3E.

FIGS. 4A-4H are schematic side views of a process for using an amorphous carbon initiation layer as described herein in a space mask double patterning process. A base material 410 is deposited on a substrate surface to begin forming a material stack 400. The base material 410 may be one or more materials used in forming semiconductor devices including a silicon substrate material, an oxide material, a polysilicon material, or the like. An amorphous carbon initiation layer 415 formed according to embodiments described herein is deposited on the base material 410 to conceal any defects present on the surface of the base material 410. A first amorphous carbon layer 420 is deposited on the amorphous carbon initiation layer 415 and a patterned resist layer 430 having a first pattern 432 is formed on the first amorphous carbon layer 420 as shown in FIG. 4A. The amorphous carbon layer 420 may be an Advanced Patterning Film™ (APF) material commercially available from Applied Materials, Inc. of Santa Clara, Calif., or alternatively, an amorphous carbon material as described herein. The resist layer 430 may be patterned by a lithographic process. The patterned resist layer 430 is then subjected to a trimming process, thereby, narrowing the width of the patterned resist materials to form a second pattern 433 defined by the trimmed resist material 431 as shown in FIG. 4B. The first amorphous carbon layer 420 and the amorphous carbon initiation layer 415 are then etched to transfer the second pattern 433 to form a patterned amorphous carbon layer 421 and patterned amorphous carbon initiation layer 416 as shown in FIG. 4C.

Sidewall spacers 440 are then formed adjacent the patterned amorphous carbon layer 421 structures and the patterned amorphous carbon initiation layer structures. Spacers may comprise an etchable material having an etching rate different from the first amorphous carbon layer 420 and amorphous carbon initiation layer 415. Suitable materials include, for example, silicon dioxide, silicon oxynitride, silicon nitride, or combinations thereof. A gap fill layer 450 of conformal amorphous carbon material is then deposited on the sidewall spacers 440 as shown in FIG. 4E. The conformal amorphous carbon material may be deposited by any of the processes described herein. Preferred conformal amorphous carbon material are those materials having similar etch characteristics as patterned amorphous carbon layer 421. The gap fill layer 450 is then etched back to expose the sidewall spacers 440 as shown in FIG. 4F. The sidewall spacers 440 are then etched to expose the base material 410 defining a hardmask layer 451 as shown in FIG. 4G. The base material 410 may then be patterned etched to form a patterned base material 411 as shown in FIG. 4H.

In an alternative process, after the sidewall spacers 440 are formed adjacent the patterned amorphous carbon layer 421 and the patterned amorphous carbon initiation layer 416 structures as shown in FIG. 4D, the patterned amorphous carbon layer 421 and the patterned amorphous carbon initiation layer 416 are then stripped from the substrate surface. The sidewall spacers 440 then form a pattern as shown in FIG. 4E', which may be used as a hardmask for the base material 410. The base material 410 may then be patterned etched to form a patterned base material 411.

FIGS. 5A-5J are schematic side views of a process for using an amorphous carbon initiation layer as described herein to etch a material layer. A base material 510 is deposited on a substrate surface (not shown) to begin forming a material stack 500. The base material may be one or more materials used in forming semiconductor devices including a silicon substrate material, an oxide material, a polysilicon material, or the like. An amorphous carbon initiation layer 515 formed according to embodiments described herein is deposited on the base material 510 to conceal any defects present on the surface of the base material 510. A first amorphous carbon layer 520 is deposited on the base material 510 and an anti-reflective coating material 530 is deposited on the first amorphous carbon layer 520 as shown in FIG. 5B. The amorphous carbon layer may be an Advanced Patterning Film™ (APF) material commercially available from Applied Materials, Inc. of Santa Clara, Calif., or alternatively, an amorphous carbon material as described herein. The anti-reflective coating material 530 is used to control the reflection of light during a lithographic patterning process. The anti-reflective coating material 530 may comprise silicon dioxide, silicon oxynitride, silicon nitride, or combinations thereof. The anti-reflective coating material may be a DARC™ material layer commercially available from Applied Materials, Inc. of Santa Clara, Calif.

A resist layer 540, such as a photoresist material, is then deposited on the anti-reflective coating material 530 as shown in FIG. 5C. The resist layer is then patterned by a lithographic process producing a patterned resist layer 541 as shown in FIG. 5D. The patterned resist layer 541 forms a first etch pattern 542.

A second amorphous carbon layer 550 is deposited conformally or substantially conformally on the patterned resist layer 541 as shown in FIG. 5E. The second amorphous carbon layer 550 is etched and patterned to form a second etch pattern 552 having reduced, e.g., narrower, feature dimensions than the first etch pattern 542 as shown in FIG. 5F. The conformal second amorphous carbon layer 550 is patterned by an anisotropic etch process to provide for sidewall amorphous carbon materials 551.

The presence of the sidewall amorphous carbon materials 551 allows for the formation of a second etch pattern 552 with reduced critical dimensions and feature sizes, i.e., increased pattern density, than can otherwise normally be achieved through current photolithographic processes. By such a process, the dimensions, such as the critical dimensions, of the features definitions formed in the resist layer can be reduced ("shrinked") to provide for a finer feature pattern in the underlying layers. The patterned resist layer 541 in combination with the sidewall amorphous carbon materials 551 may perform as a hardmask layer for the underlying anti-reflective coating material 530 and the first amorphous carbon layer 520.

The second etch pattern 552 formed with the sidewall amorphous carbon materials 551 and the resist layer 541 is transferred to the first amorphous carbon layer 520 to form a patterned first amorphous carbon layer 521 and a patterned amorphous carbon initiation layer 516 by first etching the anti-reflective coating material 530 as shown in FIG. 5G and then the first amorphous carbon layer 520 and the amorphous carbon initiation layer 515 by one or more etching processes as shown in FIG. 5H. The patterned first amorphous carbon layer 521 and the patterned amorphous carbon initiation layer 516 may perform as a hardmask for the underlying base material 510. The anti-reflective coating material 531 may be removed by the one or more etching processes or by a separate process prior to etching the underlying material.

The base material 510 is then etched using the patterned first amorphous carbon layer 521 and patterned amorphous carbon initiation layer 516 as a hardmask layer as shown in FIG. 5I and the patterned first amorphous carbon layer 521 and the patterned amorphous carbon initiation layer 516 are removed to provide a substrate surface with a patterned base material 511 having the second etch pattern 552 as shown in FIG. 5J.

Results:

Table I provides a comparison of the planarization properties for an amorphous carbon composite film as described herein (an amorphous carbon initiation layer with an amorphous carbon bulk film deposited thereon) deposited over a polysilicon substrate verses an amorphous carbon bulk film (e.g., APF 550 available from Applied Materials, Inc. of Santa Clara, Calif.) deposited directly over a polysilicon substrate. The results depicted in Table I demonstrate that while providing many of the same properties as the APF550 film alone, the composite a:C film minimizes stack defects relative to the APF550 film deposited alone.

TABLE I

|  | Composite a: C film | APF550 |
|---|---|---|
| Normalized Etch Selectivity | 1.5 | 1 |
| Line Edge Roughness (LER) | 2.2 nm | 2.2 nm |
| Max (L/S) Feature Size Aspect Ratio at 200 nm Film Thickness | 10:1 | 10:1 |
| Stack Defects @ >nm | <100 | >1,000 |
| 32 nm Line Breakage Due to Defects | None | Some |

Figure 6:
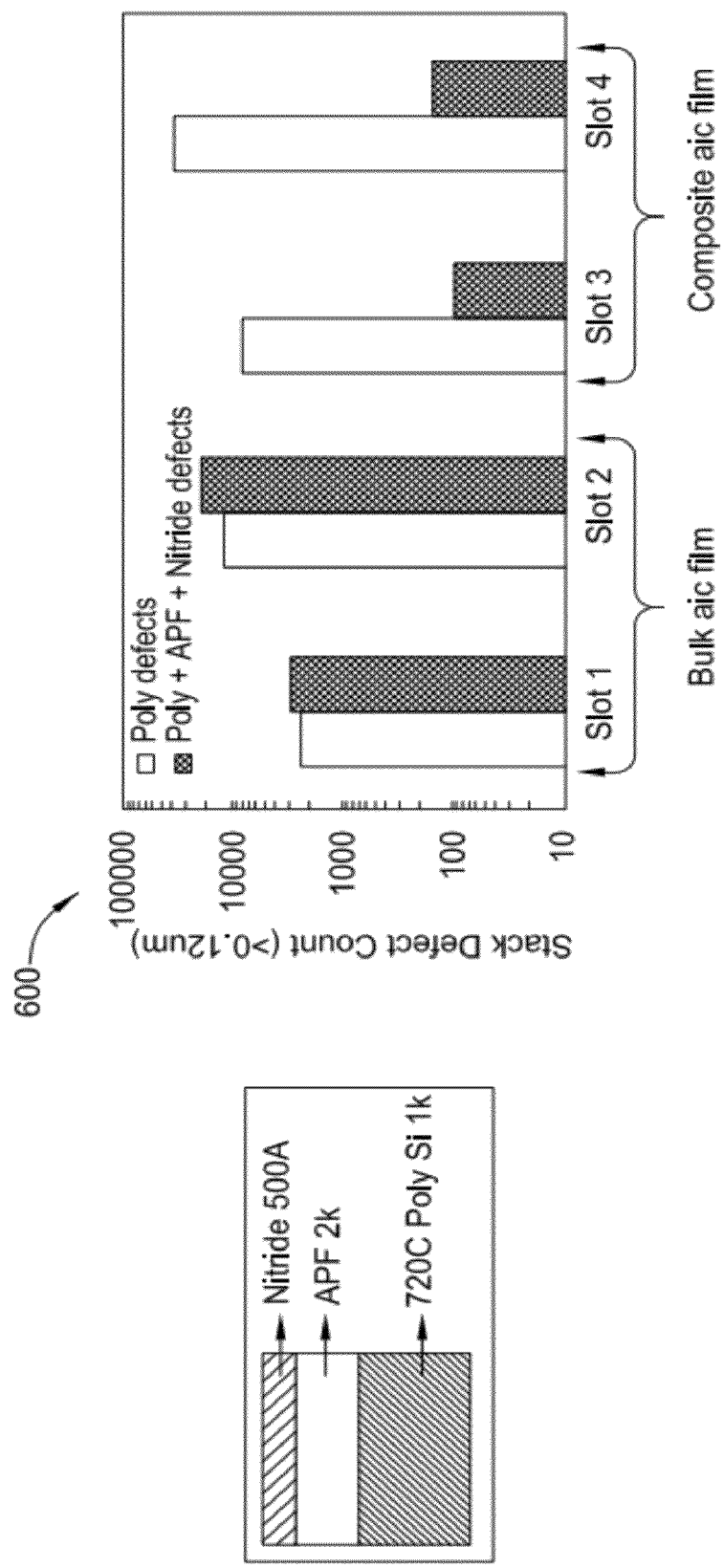
FIG. 6 depicts a plot showing stack defectivity comparison for an amorphous carbon bulk film verses a composite amorphous carbon film deposited according to embodiments described herein.
Figures 7A, 7B, 7C, 7D:
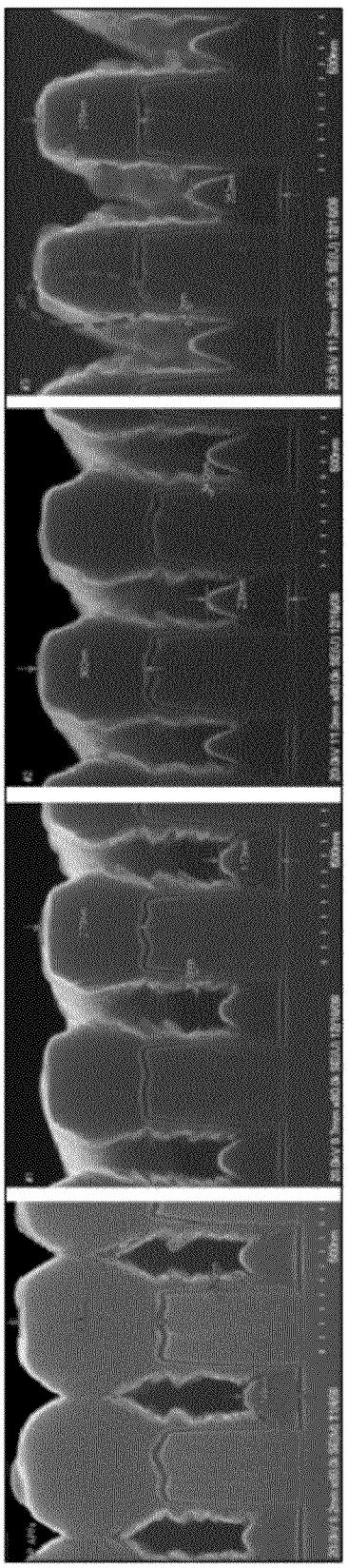
FIGS. 7A-7D depict scanning electron microscope images illustrating the reduction of lateral expansion growth for a structure deposited according to embodiments described herein.

FIG. 6 depicts a plot 600 showing stack defectivity comparison for an amorphous carbon bulk film verses a composite amorphous carbon film deposited according to embodiments described herein. The y-axis shows the stack defect count (>0.12 μm) and the x-axis shows the sample number (Slot 1, Slot 2, Slot 3, and Slot 4). The material stack for Slot 1 and Slot 2 comprises a 1,000 Å polysilicon substrate, a 2,000 Å bulk a:c layer deposited over the 1,000 Å polysilicon substrate, and a 500 Å silicon nitride layer deposited over the bulk a:c layer. The material stack for Slot 3 and Slot 4 is similar to the material stack for Slot 1 and Slot 2, however, an amorphous carbon initiation layer as described herein was deposited over the polysilicon substrate prior to deposition of the a:c bulk layer. Both Slot 1 and Slot 2 show an increase in measured defects when comparing the number of defects on the initial polysilicon substrate with the number of defects on the material stack. In comparison, Slot 3 and Slot 4 show over ten times reduction in stack defectivity when comparing the measured defects on the polysilicon substrate with the number of defects on the material stack. Thus the deposition of an amorphous carbon initiation layer as described herein decreases stack defectivity.

Figure 8:
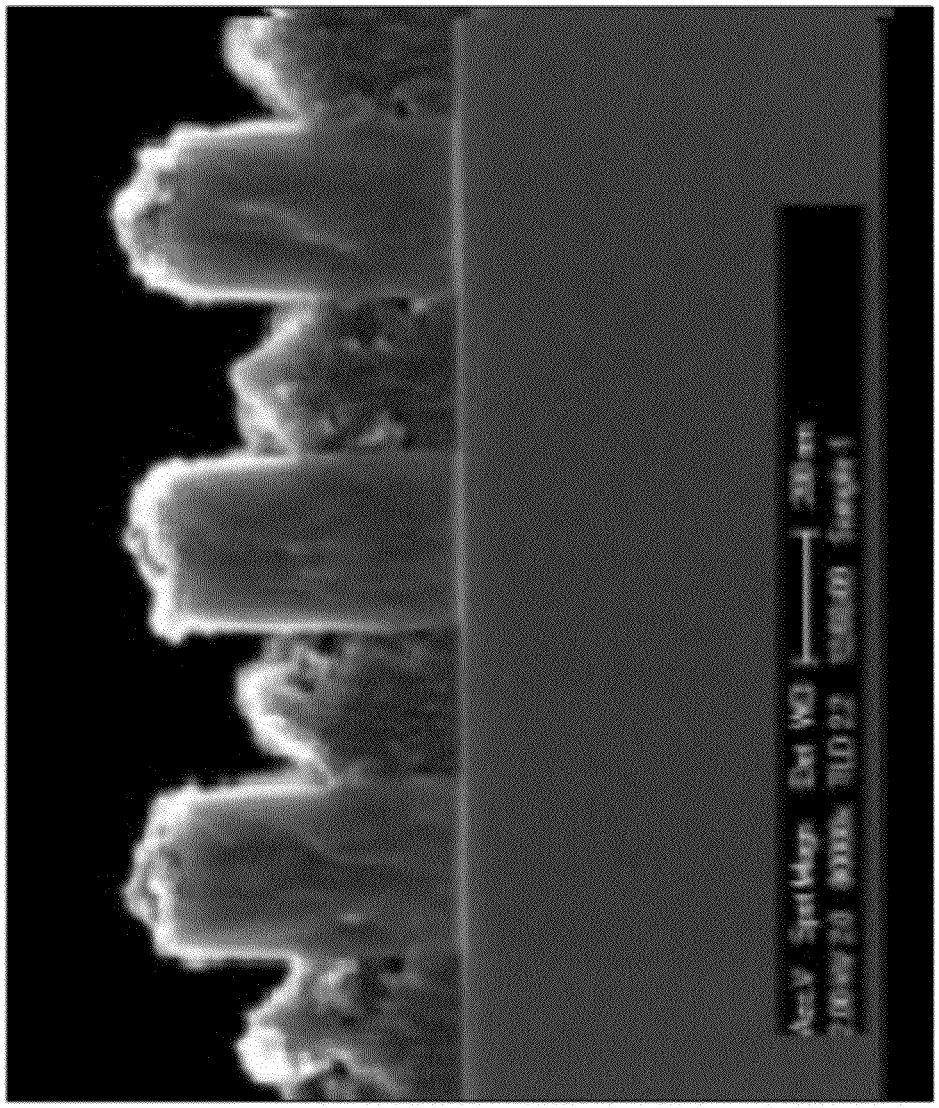
FIG. 8 depicts a scanning electron microscope image illustrating the 'gap-fill' like nature of amorphous carbon growth.

FIGS. 7A-7D depict scanning electron microscope images illustrating the reduction of lateral expansion growth for a structure deposited according to embodiments described herein. FIG. 8 depicts a scanning electron microscope image illustrating the 'gap-fill' like nature of amorphous carbon growth according to embodiments described herein. As shown in FIGS. 7A-7D, using the process conditions disclosed herein, it is possible to have minimal deposition on the top of a defect while growth takes place on the sides of the defect, as illustrated by the 'gap-fill' like nature of the amorphous carbon growth in FIG. 8. The embodiments described herein allow for the deposition of subsequent planar layers and an overall reduction in stack defects.

While the foregoing is directed to embodiments of the present invention, other and further embodiments of the invention may be devised without departing from the basic scope thereof, and the scope thereof is determined by the claims that follow.

The invention claimed is:

1. A method of forming a composite amorphous carbon layer for improved stack defectivity on a substrate, comprising:
   introducing a hydrocarbon source gas into a process chamber containing a substrate having a defect formed thereon;
   introducing a diluent source gas into the process chamber;
   introducing a plasma-initiating gas into the process chamber;
   generating a plasma in the process chamber;

forming an amorphous carbon initiation layer on the substrate, wherein a ratio of a volumetric flow rate of the hydrocarbon source gas to a volumetric flow rate of the diluent source gas is 1:12 or less and wherein the amorphous carbon initiation layer suppresses the growth of the defect; and forming a bulk amorphous carbon layer on the amorphous carbon initiation layer, wherein a volumetric flow rate of a hydrocarbon source gas used to form the bulk amorphous carbon layer to a volumetric flow rate of a diluent source gas is 1:6 or greater to form the composite amorphous carbon layer.

2. The method of claim 1, wherein the substrate comprises materials selected from the group consisting of: silicon materials, oxide materials, and combinations thereof.

3. The method of claim 2, wherein the substrate comprises a polysilicon material.

4. The method of claim 1, wherein a thickness of the amorphous carbon initiation layer substantially matches the height of the largest defect.

5. The method of claim 1, further comprising:
flowing the hydrocarbon source gas at a flow rate from about 200 sccm to about 700 sccm;
flowing the diluent source gas at a flow rate from about 7,000 sccm to about 9,000 sccm; and
flowing the plasma initiating gas at a flow rate from about 1,000 sccm to about 2,000 sccm.

6. The method of claim 1, wherein the ratio of the volumetric flow rate of the hydrocarbon source gas and the volumetric flow rate of the diluent source gas for the amorphous carbon initiation layer is between about 1:18 to 1:14.

7. The method of claim 6, wherein the ratio of the volumetric flow rate of the hydrocarbon source gas to the volumetric flow rate of the diluent source gas for the bulk amorphous carbon layer is between about 1:4 to 2:1.

8. The method of claim 1, wherein the ratio of the volumetric flow rate of the hydrocarbon source gas and the volumetric flow rate of the diluent source gas for the amorphous carbon initiation layer is between about 1:32 to 1:18.

9. The method of claim 8, wherein the as-deposited composite amorphous carbon layer has an adjustable hydrogen content that ranges from about 25% hydrogen to about 50% hydrogen and an adjustable carbon content that ranges from about 50% to about 75% carbon.

10. The method of claim 1, wherein the hydrocarbon source gas is selected from the group consisting of acetylene ($C_2H_2$), propylene ($C_3H_6$), propyne ($C_3H_4$), propane ($C_3H_8$), butane ($C_4H_{10}$), butylene ($C_4H_8$), butadiene ($C_4H_6$), vinylacetylene, and combinations thereof.

11. The method of claim 10, wherein the diluent source gas is selected from the group consisting of hydrogen ($H_2$), ammonia ($NH_3$), CO, $CO_2$, and combinations thereof.

12. A method of forming a device comprising:
forming an amorphous carbon initiation layer on a substrate by:
providing a gas mixture to a process chamber containing a polysilicon substrate, wherein the gas mixture comprises a hydrocarbon source gas, a diluent source gas, and a plasma-initiating gas, wherein a ratio of a volumetric flow rate of the hydrocarbon source gas to a volumetric flow rate of the diluent source gas is 1:12 or less and wherein the hydrocarbon source gas is selected from the group consisting of acetylene ($C_2H_2$), propylene ($C_3H_6$), propyne ($C_3H_4$), propane ($C_3H_8$), butane ($C_4H_{10}$), butylene ($C_4H_8$), butadiene ($C_4H_6$), vinylacetylene, and combinations thereof; and
generating a plasma in the process chamber to decompose the hydrocarbon source gas in the gas mixture to form the amorphous carbon initiation layer on the substrate;
forming a bulk amorphous carbon layer on the amorphous carbon initiation layer, wherein a hydrocarbon source gas and a diluent source gas are used to form the bulk amorphous carbon layer, wherein a ratio of a volumetric flow rate of the hydrocarbon source gas to a volumetric flow rate of the diluent source gas is 1:6 or greater to form a composite amorphous carbon layer;
defining a pattern in at least one region of the bulk amorphous carbon layer and the amorphous carbon initiation layer; and
transferring the pattern defined in the at least one region of the bulk amorphous carbon layer and the amorphous carbon initiation layer into the polysilicon substrate using the bulk amorphous carbon layer and the amorphous carbon initiation layer as a mask.

13. The method of claim 12, wherein the ratio of the volumetric flow rate of the hydrocarbon source gas and the volumetric flow rate of the diluent source gas for the amorphous carbon initiation layer is between 1:18 to 1:14.

14. The method of claim 13, wherein the ratio of the volumetric flow rate of the hydrocarbon source gas to the volumetric flow rate for the diluent source gas for the bulk amorphous carbon layer is between about 1:6 to 2:1.

15. The method of claim 12, wherein the as-deposited amorphous carbon initiation layer has an adjustable hydrogen content that ranges from about 10% hydrogen to about 25% hydrogen.

16. The method of claim 12, wherein the as-deposited composite amorphous carbon layer has an adjustable hydrogen content that ranges from about 10% hydrogen to about 25% hydrogen and an adjustable carbon content that ranges from about 75% to about 90% carbon.

17. The method of claim 12, wherein a pressure in the process chamber is between about 5 Torr to about 9 Torr during the forming an amorphous carbon initiation layer on a substrate.

18. The method of claim 17, further comprising heating the substrate to a temperature of between about 200° C. to about 700° C. during the forming an amorphous carbon initiation layer on a substrate.

19. The method of claim 12, wherein the diluent source gas is selected from the group consisting of hydrogen ($H_2$), ammonia ($NH_3$), CO, $CO_2$, and combinations thereof.

* * * * *